(12) United States Patent
Honda et al.

(10) Patent No.: US 6,365,840 B1
(45) Date of Patent: Apr. 2, 2002

(54) ELECTRICAL CONNECTING DEVICE AND ELECTRICAL CONNECTING METHOD

(75) Inventors: Noriyuki Honda, Aichi; Yasuhiro Suga, Tochigi, both of (JP)

(73) Assignees: Sony Corporation; Sony Chemicals Corporation, both of Tokyo (JP)

( * ) Notice: Subject to any disclaimer, the term of this patent is extended or adjusted under 35 U.S.C. 154(b) by 0 days.

(21) Appl. No.: 09/362,057

(22) Filed: Jul. 28, 1999

(30) Foreign Application Priority Data

Aug. 3, 1998 (JP) .......................................... 10-219216
Feb. 16, 1999 (JP) .......................................... 11-037471

(51) Int. Cl.⁷ .............................. H05K 1/16; H05K 1/02
(52) U.S. Cl. ...................... 174/259; 174/255; 174/260; 361/760; 361/773; 361/779; 257/737; 257/778; 257/783
(58) Field of Search ................................ 174/260, 259, 174/52.1, 52.4, 255; 361/760, 736, 748, 761, 765, 773, 774, 779, 762, 783, 790; 428/214; 439/66, 65, 67, 68, 69, 70; 257/737, 773, 778, 783, 711, 713

(56) References Cited

U.S. PATENT DOCUMENTS

| 4,640,981 A | * | 2/1987 | Dery et al. ................ 174/88 R |
| 4,902,857 A | * | 2/1990 | Cranston et al. .......... 174/94 R |
| 4,999,460 A | * | 3/1991 | Sugiyama et al. ......... 174/94 R |
| 5,155,301 A | * | 10/1992 | Mase ........................ 174/88 R |
| 5,332,869 A | * | 7/1994 | Hagiwara .................... 174/257 |
| 5,578,527 A | * | 11/1996 | Chang et al. ............. 156/273.9 |
| 5,672,400 A | * | 9/1997 | Hansen et al. ............. 428/40.1 |
| 5,804,882 A | * | 9/1998 | Tsukagoshi et al. ........ 257/783 |
| 5,965,064 A | * | 10/1999 | Yamada et al. ............. 252/512 |
| 6,034,331 A | * | 3/2000 | Tsukagoshi et al. ........ 174/250 |
| 6,223,429 B1 | * | 5/2001 | Kaneda et al. ................. 29/832 |

FOREIGN PATENT DOCUMENTS

| JP | 408148211 | * | 6/1996 |
| JP | 408148212 | * | 6/1996 |

* cited by examiner

Primary Examiner—Jeffrey Gaffin
Assistant Examiner—I B Patel
(74) Attorney, Agent, or Firm—Sonnenschein, Nath & Rosenthal

(57) ABSTRACT

The present invention provides an electrical connecting member and an electrical connecting method for achieving electrical connection securely through conductive particles regardless of a slight unevenness of an object matter. An electrical connecting device (10) for electrically connecting an electrical connecting portion (5) of a first object to an electrical connecting portion (3) of a second object comprises an adhesive layer (6) disposed on the first object (4) and constituted of a plurality of conductive particles (7) and a binder (8) containing the plurality of the conductive particles (7) and a paste (9) having a fluidity and disposed on the film-like adhesive layer (6).

11 Claims, 5 Drawing Sheets

US 6,365,840 B1

ELECTRICAL CONNECTING DEVICE AND ELECTRICAL CONNECTING METHOD

RELATED APPLICATION DATA

The present application claims priority to Japanese Application No. P10-219216 filed Aug. 3, 1998 and Japanese Application No. P11-037471 filed Feb. 16, 1999, which applications are incorporated herein by reference to the extent permitted by law.

BACKGROUND OF THE INVENTION

1. Field of the Invention

The present invention relates to an electrical connecting device and an electrical connecting method for electrically connecting an electrical connecting portion of a first object to an electrical connecting portion of a second object.

2. Description of the Related Art

With recent smaller sized and decreased thickness of electronic parts, circuits for use therein have been denser and more precise, so that connection of such an electronic part to a fine electrode is difficult with conventional soldering method, rubber connector or the like. Therefore, adhesive agent and film material (hereinafter referred to as connecting member) having anisotropy excellent in fine pitching and conductivity have been often used.

This connecting member is constituted of the adhesive agent containing a predetermined amount of conductive material such as conductive particles and so on. This connecting member is disposed between each of protruding electrodes of an electronic part and a conductive pattern of a printed wiring board. By applying a pressure or heating with a pressure, the electrodes on both the parts are electrically connected to each other and electrodes formed adjacent each other of the same are provided with an electrical insulation. As a result, the protruding electrodes of the electronic part and the conductive pattern of the printed wiring board are bonded to each other and fixed.

A basic concept for making the above connecting member correspond to the fine pitch is that an insulation between adjacent electrodes is secured by making a diameter of each of conductive particles smaller than the insulating portion between the adjacent electrodes, the containing amount of the conductive particles is set to such an extent that the particles do not contact each other and conductivity of the connecting portion is obtained by making the conductive particles exist securely on the electrodes.

If the diameter of the conductive particle is reduced according to the above conventional method, however, an area of the conductive particle' surface increases remarkably so that a secondary cohesion occurs, thereby combining adjacent particles with each other. As a result, the insulation between the adjacent electrodes cannot be maintained. If the containing amount of the conductive particles decreases, the number of the conductive particles on electrodes to be connected also decreases so that the number of contacting points becomes short. As a result, the conduction between the connecting electrodes cannot be obtained. Consequently, it is difficult to make the connecting member correspond to fine pitch while a long term connecting reliability is maintained.

That is, by a remarkable correspondence to the fine pitch trend, miniaturization of an electrode area and a gap (space) between adjacent electrodes have progressed, so that the conductive particles on the electrodes flows out between the adjacent electrodes with adhesive agent because of pressurization at the time of connection or heating with a pressure.

To solve such a problem, conventionally, a connecting member in which by coating the conductive particles for insulation, a quantity of the conductive particles in the connecting member is increased and a connecting member constituted of an adhesive layer containing the conductive particles and a layer not containing them have been proposed.

FIGS. 1 and 2 show these conventional connecting members.

In case where an object is a glass substrate 200 as shown in FIG. 1, flatness of a mounting region for an IC (integrated circuit) 201 in glass substrate 200 is about ±0.5 μm and if in protruding electrodes 202 of the IC 201, there is few deflection (about ±0.5 μm) in the height of each protruding electrode like a gold plated bump, it is possible to electrically connect the wiring pattern 203 of the glass substrate 200 to the protruding electrodes 202 of the IC 201 through conductive particles 205 contained in a connecting member 204.

Because each of the parts such as the ICs is flat, if the thickness of the connecting member 204 is a height of the protruding electrode 202 of the IC 201 (ordinarily, about 15–25 μm and ITO pattern wired on a glass is some Angstrom) about ±5 μm, the connecting member 204 is charged securely under the IC 201. Therefore, the connecting member 204 does not have to be made thicker than necessary and at the stage of temporary pressure-fitting (pressurization) of an initial period of mounting, the conductive particles 205 can be nipped between the wiring pattern 203 on the glass substrate 200 and the protruding electrodes 202 of the IC 201. After that, even if the binder of the connecting member flows out at the time of pressure-fitting (heating with a pressure), the nipped conductive particles 205 do not flow out, so that when the connecting member is hardened, an electrical connection is established between the wiring pattern 203 on the glass substrate 200 and the protruding electrode 202 of the IC 201 through the conductive particles 205.

In FIG. 1(A), the connecting member 204 (for example, anisotropic conductive film: ACF) is bonded to the glass substrate 200. Usually, the anisotropic conductive film is bonded onto the glass substrate 200 by carrying out ordinary heating with a pressure (heating with a pressure is performed at a pressure of about 100 N/cm² and a heating temperature of 70–100° C.). With this state, positioning between the wiring pattern 203 of the glass substrate 200 and the protruding electrode 202 of the IC 201 is carried out.

In FIG. 1(B), the IC 201 is temporarily press-fit to the glass substrate 200. The temporary press-fitting of the IC 201 is carried out by only a pressure or heating with a pressure (heating temperature is about 70–100° C.).

In FIG. 1(C), the IC 201 is finally press-fit to the glass substrate 200. The final press-fitting of the IC 201 is carried out by heating with a pressure. Because a temperature at this time is higher than the glass transition temperature of the anisotropic conductive film, a flow of the binder occurs. At this time, the conductive particles 205 nipped between the protruding electrode 202 of the IC 201 and the wiring pattern 203 of the glass substrate 200 does not flow, but the other conductive particles 205 flow.

FIG. 1(D) shows a state in which the anisotropic conductive film is hardened. If heating with a pressure is carried out in the final press-fitting, after resin flows, it is hardened. This series of the above described processes is the connecting process.

However, if the object is not a glass substrate but a printed wiring board 300 as shown in FIG. 2, a deflection (± several μm) may be generated in the height of the wiring pattern 303 or a deflection (± several μm) may be generated in the height of the protruding electrode 202 of the IC 201 like a gold wire bump. In this case, if the thickness of the connecting member 204 is height of the wiring pattern 303 of the printed wiring board 300 (about 20 μm) plus height of the protruding electrode of the IC (about 20 μm), it is necessary to add 10–20 μm to the above thickness by considering the safety.

In this case, because the thickness of the connecting member 204 is large at the stage of temporary press-fitting (pressurization) of the initial period of mounting, the conductive particles 205 cannot be nipped between the wiring pattern 303 of the printed wiring board 300 and the protruding electrode 202 of the IC 201. After that, when the binder of the connecting member 204 flows at the time of final press-fitting (heating with a pressure), the conductive particles 205 also flow. When the gap between the wiring pattern 303 of the printed wiring board 300 and the protruding electrode 202 of the IC 201 coincides with the size of each of the conductive particles 205, the flowing conductive particles 205 are nipped therebetween. However, the conductive particles 205 are not concerned with every connection. Therefore, electrical connection will not be secured. Alternatively, as it is necessary to obtain parts having a strict specification, cost is increased.

FIG. 2(A) shows a state in which the connecting member 204 (for example, anisotropic conductive film) is bonded to the printed wiring board 300. The anisotropic conductive film is pasted onto the printed wiring board 300 by normal heating with a pressure (this heating with a pressure is carried out at a pressure of about 100 N/cm$^2$ and a heating temperature of about 70–100° C.). In this state, positioning of the wiring pattern 303 of the printed wiring board 300 and the protruding electrode 202 of the IC 201 is carried out.

FIG. 2(B) shows a state in which the IC 201 is temporarily press-fit to the printed wiring board 300. The temporary press-fitting for the IC 201 is carried out by only pressurization or heating with a pressure (heating temperature is about 70–100° C.).

FIG. 2(C) shows a state in which the IC 201 is finally press-fit to the printed wiring board 300. The final press-fitting of the IC 201 is carried out by heating with a pressure, and because the temperature at this time is higher than the glass transition temperature of the anisotropic conductive film, the binder flows. Because at this time, no conductive particles 205 are nipped between the protruding electrodes 202 of the IC 201 and the wiring pattern 303 of the printed wiring board 300, all the conductive particles 205 flow. Thus, when the gap between the wiring pattern 303 of the printed wiring board 300 and the protruding electrode 202 of the IC 201 coincides with the diameter of the conductive particle 205, the flowing conductive particles 205 to the gap are nipped therebetween. Therefore, the conductive particles 205 do not exist in every gap between the wiring pattern and protruding electrode.

FIG. 2(D) shows a state in which the anisotropic conductive film is hardened. If heating with a pressure is carried out in the final press-fitting, resin is hardened after a flow. The series of these steps is a connecting process.

Therefore, if electrical connection via the conductive particles is achieved regardless of a slight unevenness of the printed wiring board which is an object and a slight unevenness of the protruding electrode of the IC, it can be considered that a reliability sufficient for practical use can be obtained even on a printed wiring board whose cost is suppressed.

SUMMARY OF THE INVENTION

Accordingly, the present invention has been achieved in views of the above problems, and therefore, it is an object of the invention to provide an electrical connecting member and electrical connecting method capable of achieving electrical connection via conductive particles regardless of a slight unevenness of an object material.

To achieve the above object, according to a first aspect of the present invention, there is provided an electrical connecting device for electrically connecting an electrical connecting portion of a first object to an electrical connecting portion of a second object, the electrical connecting device comprising a film-like adhesive layer to be disposed on the first object and constituted of a plurality of conductive particles and a binder containing the conductive particles; and paste disposed on the film-like adhesive layer and having a fluidity.

According to the first aspect of the invention, the film-like adhesive layer and paste are possessed to achieve electrical connection between the electrical connecting portion of the first object and the electrical connecting portion of the second object.

The film-like adhesive layer is an adhesive layer to be disposed on the first object and constituted of a plurality of conductive particles and a binder containing the conductive particles. The paste is disposed on the film-like adhesive layer and has a fluidity.

Thus, only by disposing the film-like adhesive layer on the first object and then paste on the film-like adhesive layer, in the electrical connecting portions of the first and second objects, the paste having a fluidity is nipped between the first object and second object and flows, so that the conductive particles in the film-like adhesive layer are not moved but only the paste flows. Therefore, regardless of a slight unevenness in the first object, the first object and second object can be closely fit to each other, and the electrical connecting portion of the first object can be electrically connected to the electrical connecting portion of the second object positively by using the conductive particles in the film-like adhesive layer.

Preferably, according to a second aspect of the present invention, each of the conductive particles has an almost uniform diameter. According to a third aspect of the present invention, preferably, the material of the paste is the same adhesive agent as the material of the binder of the film-like adhesive layer.

As a result, when the paste and the binder in the film-like adhesive layer are heated with a pressure, they react therewith so as to affix the first object and second object to each other. Because the conductive particles have almost uniform diameter, the electrical connecting portion of the first object can be connected to the electrical connecting portion of the second object securely such that they positively nip the conductive particles therebetween and are not floated.

According to a fourth aspect of the present invention, preferably, the thickness of the film-like adhesive layer is set almost equal to or larger than the diameter of each of the conductive particles.

As a result, a case in which any conductive particle projects from the film-like adhesive layer is eliminated.

According to a fifth aspect of the present invention, preferably, the viscosity of the paste is set to be smaller than the viscosity of the film-like adhesive layer.

As a result, the paste flows with a precedence in a gap between the first object and second object and hence the film-like adhesive layer is not moved, thereby making it possible to hold the conductive particles firmly thereat.

According to a sixth aspect of the present invention, preferably, the electrical connecting portion of the first object is a wiring pattern on a circuit substrate, the electrical connecting portion of the second object is an protruding electrode of an electronic part and the conductive particles in the film-like adhesive layer electrically connects the wiring pattern of the circuit substrate to the protruding electrodes of the electronic part.

As a result, the wiring pattern of the circuit substrate and the protruding electrodes of the electronic part can be electrically connected to each other by using the conductive particles in the film-like adhesive layer.

According to the third aspect of the present invention, a melting temperature of the paste is preferably set lower than the melting temperature of the film-like adhesive layer.

According to a seventh aspect of the present invention, there is provided an electrical connecting method for electrically connecting an electrical connecting portion of a first object to an electrical connecting portion of a second object, the electrical connecting method comprising the steps of: adhesive layer allocation step for allocating a film-like adhesive layer constituted of a plurality of conductive particles and a binder containing the conductive particles on the electrical connecting portion of the first object; paste allocation step for allocating paste having fluidity on the film-like adhesive layer; and connecting step for heating with a pressure for electrically connecting the electrical connecting portion of the first object to the electrical connecting portion of the second object through the conductive particles in the film-like adhesive layer.

According to the seventh aspect of the invention, at the adhesive layer allocation step, the film-like adhesive layer constituted of a plurality of the conductive particles and a binder containing the conductive particles is disposed on the electrical connecting portion of the first object.

At the paste allocation step, the paste having the fluidity is disposed on the film-like adhesive layer.

At the connecting step, heating with a pressure is carried out to electrically connect the electrical connecting portion of the first object to the electrical connecting portion of the second object by the conductive particles in the film-like adhesive layer.

As a result, only by disposing the film-like adhesive layer on the first object and then paste on the film-like adhesive layer, in the electrical connecting portions of the first and second objects, the paste having the fluidity is nipped between the first object and second object and flows. Thus, because only the paste flows while the conductive particles in the film-like adhesive layer are not moved, the first object and second object can be closely fit to each other even if there is slight unevenness in the first object, so that the electrical connecting portion of the first object can be electrically connected to the electrical connecting portion of the second object surely by using the conductive particles in the film-like adhesive layer.

According to an eighth aspect of the present invention, preferably, the connecting step comprises a first pressure heating step for heating at a temperature below a glass transition temperature of a binder and paste with a pressure; and a second pressure heating step for heating at a temperature above the glass transition temperature of the binder and paste with a pressure.

As a result, because the binder and paste are heated at a temperature below the glass transition temperature at the first pressure heating step, they are hardened only temporarily.

Because at the second pressure heating step, the binder and paste are heated with a pressure at a temperature higher than the glass transition temperature of the binder and paste, the binder and paste are hardened completely.

According to a ninth aspect of the present invention, preferably, the binder and paste are of the same or almost equal component.

According to an eleventh aspect of the present invention, preferably, the connecting step comprises a first pressure heating step for heating at a temperature below the melting temperature of the binder and above the melting temperature of the paste with a pressure; and thereafter a second pressure heating step for heating at a temperature above a reaction starting temperature of the binder and paste with a pressure.

DETAILED DESCRIPTION OF THE PREFERRED EMBODIMENT

Hereinafter, preferred embodiments of the present invention will be described in detail with reference to the accompanying drawings.

Meanwhile, although the embodiments which will be described below are provided with various preferred technical limitations because they are preferred embodiments of the present invention, the scope of the present invention is not restricted to these embodiments as long as there is no particular description about limiting the present invention.

Figure 1A:
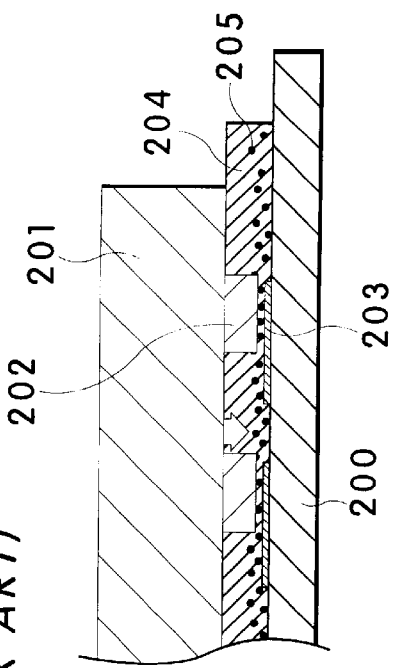
FIG. 1 is a diagram showing an example of electrical connection in a conventional electronic device.
Figure 1B:
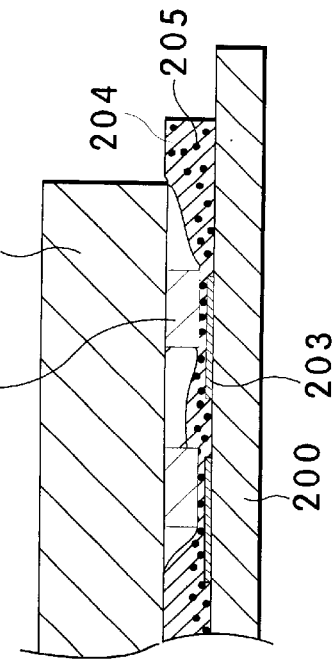
Figure 1C:
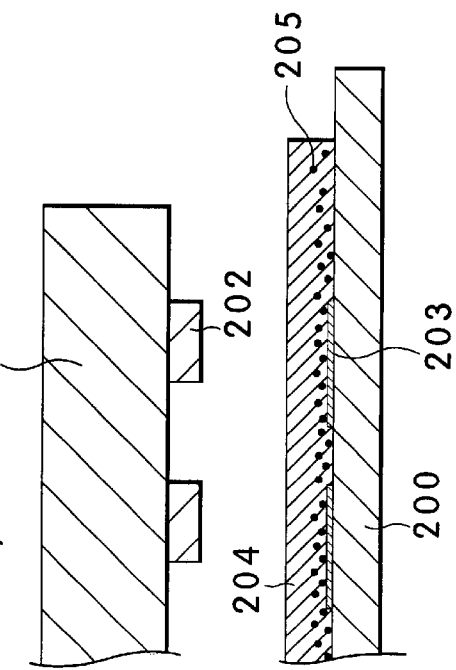
Figure 1D:
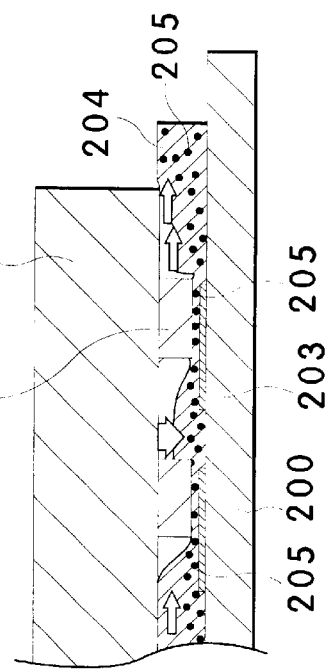
Figure 2A:
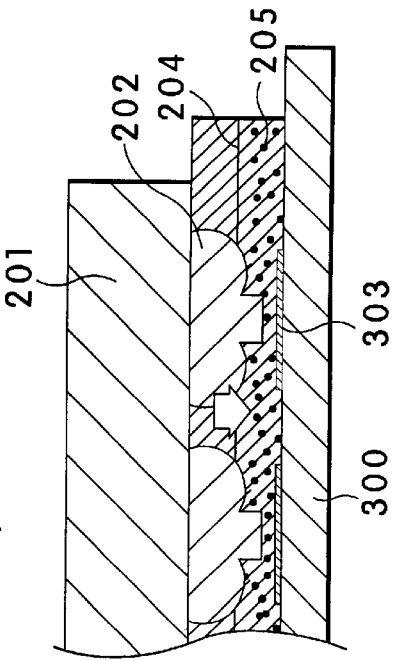
FIG. 2 is a diagram showing other example of electrical connection in a conventional electronic device.
Figure 2B:
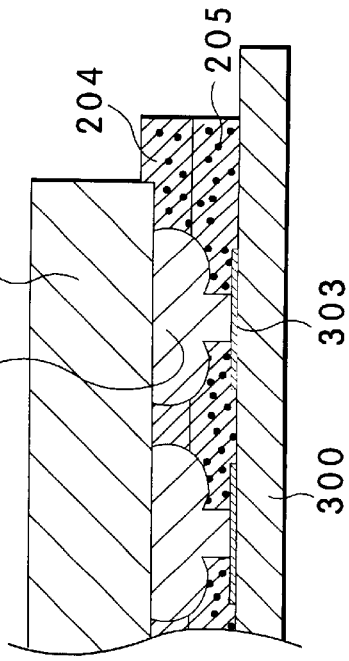
Figure 2C:
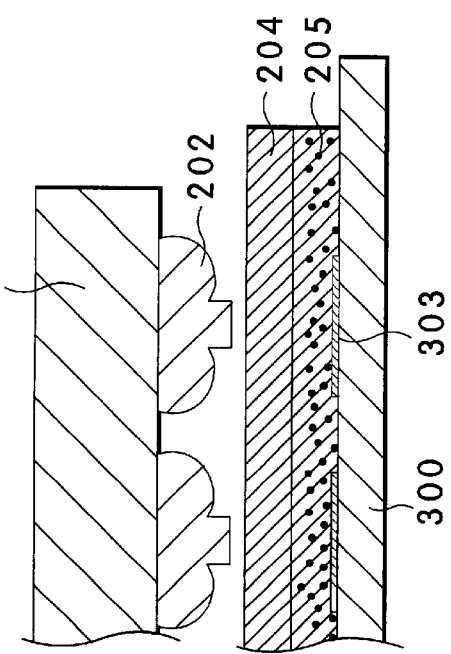
Figure 2D:
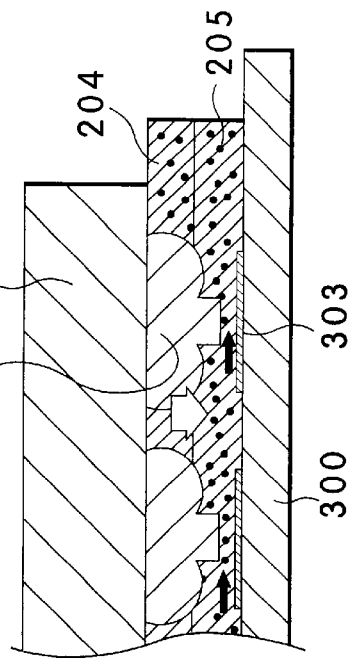
Figure 3:
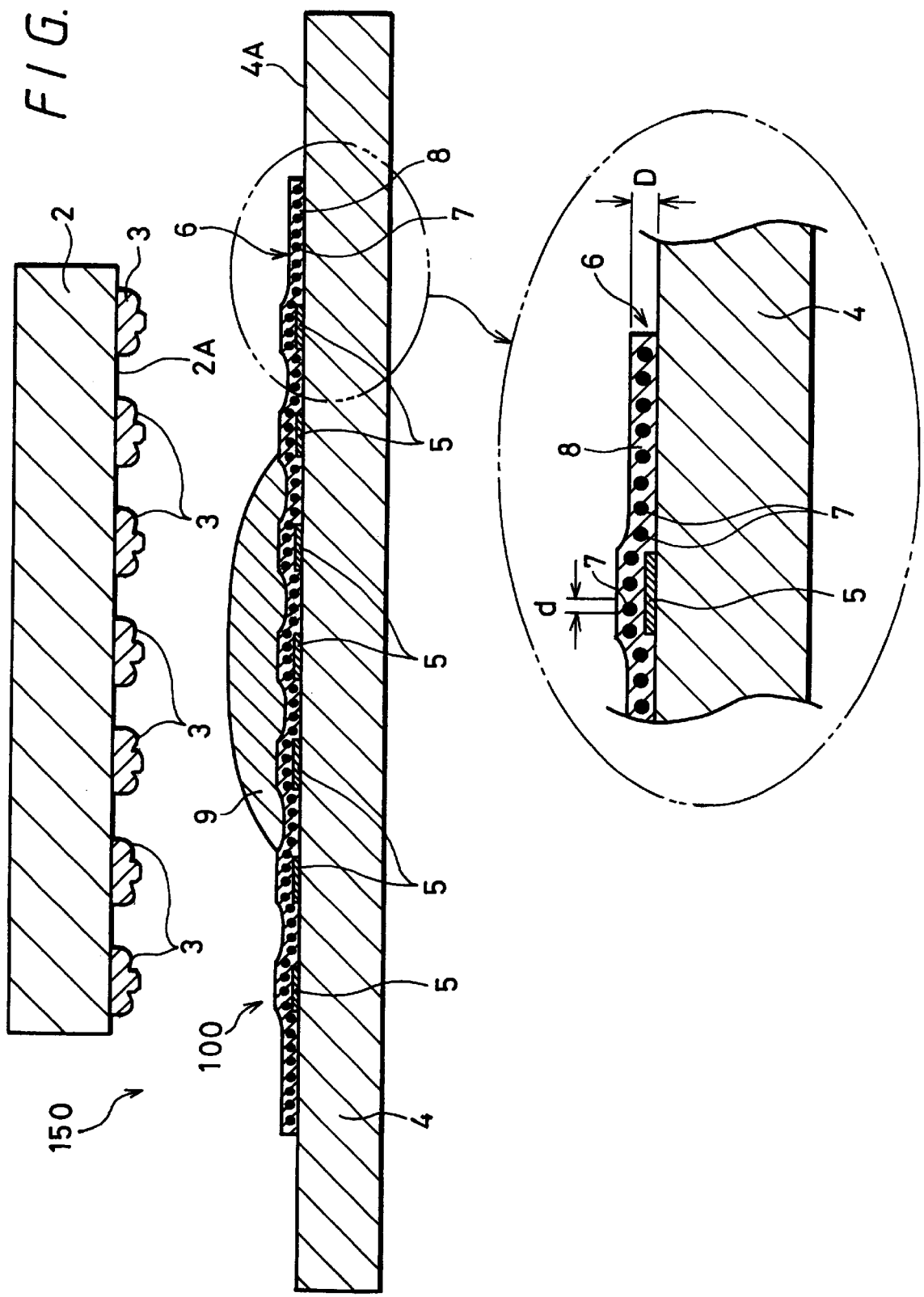
FIG. 3 is a diagram showing an example of an electronic device having an electrical connecting device according to the present invention.

FIG. 3 shows an example of an electronic device 150 electrically connected according to a preferred embodiment of an electrical connecting device 100 of the present invention. This electronic device 150 comprises a printed wiring board 4 and an IC (integrated circuit) 2 which is an example of electronic parts.

A wiring pattern 5 with a predetermined pattern is formed on a surface 4A of the printed wiring board 4. This wiring pattern 5 is an electrical wiring pattern made of for example, aluminum or copper.

A plurality of protruding electrodes 3 are provided on a surface 2A of the IC 2. Each of the protruding electrodes 3 is called a bump and the protruding electrodes 3 are disposed so as to protrude corresponding to the wiring pattern 5 of the printed wiring board 4.

The printed wiring board 4 corresponds to a first object and the wiring pattern 5 of the printed wiring board 4 corresponds to the wiring pattern of the circuit substrate. On the other hand, the IC 2 is an electronic part corresponding to a second object. The electrical connecting device 100 has a function for electrically connecting the wiring pattern 5 of the printed wiring board 4 with the protruding electrodes 3 of the IC 2 and positively bonding the printed wiring board 4 to the IC 2 mechanically.

Next, the electrical connecting device 100 will be described.

As shown in FIG. 3, the electrical connecting device 100 is constituted of a film-like adhesive layer 6 and a paste 9. The film-like adhesive layer 6 is a film-like material to be disposed on the surface 4A of the printed wiring board 4 and the film-like adhesive layer 6 is attached to the one surface 4A so as to cover the wiring pattern 5.

The film-like adhesive layer 6 contains conductive particles 7 and a binder 8. The binder 8 includes a number of or a plurality of the conductive particles 7. Each of the conductive particles 7 is a spherical particle produced by plating, for example, a plastic resin particle (5 μm in diameter) with Ni (300–1000 Å thick) and further plating with Au (300–1000 Å thick) or a metallic powder (5–10 μm) of Ni.

The binder 8 contains a plurality of or a number of conductive particles 7 in a condition that they are not moved therein. The binder 8 is made of, for example, thermosetting type epoxy resin having electrical insulation property.

Preferably, it is desired that a thickness D of this binder 8 is set to be slightly larger than or equal to a diameter d of the conductive particles 7. Consequently, the conductive particles 7 are completely contained in the binder 8 serving as an electrically insulating layer so that they are not protruded therefrom.

As shown in FIG. 3, preferably the conductive particles 7 are arranged uniformly in the binder 8.

The paste 9 is coated on the film-like adhesive layer 6. As the material of the paste 9, preferably, bonding material of adhesive material having the same components as the binder 8 and an electrical insulation property is used. That is, the paste 9 is made of, for example, thermosetting type epoxy resin. Namely, for the binder 8 and paste 9, preferably, the same reactive adhesive agent which carries out the same reaction at the same time when they are pressurized and heated may be used.

Preferably, the viscosity of the paste 9 is set lower than that of the binder 8. That is, the paste 9 has a higher fluidity than the binder 8. When the IC 2 is pressed to the one surface 4A of the printed wiring board 4 via the electrical connecting device 100, only the paste 9 flows between the film-like adhesive layer 6 and the one surface 2A of the IC 2 so that the gap is filled therewith.

Figure 4:
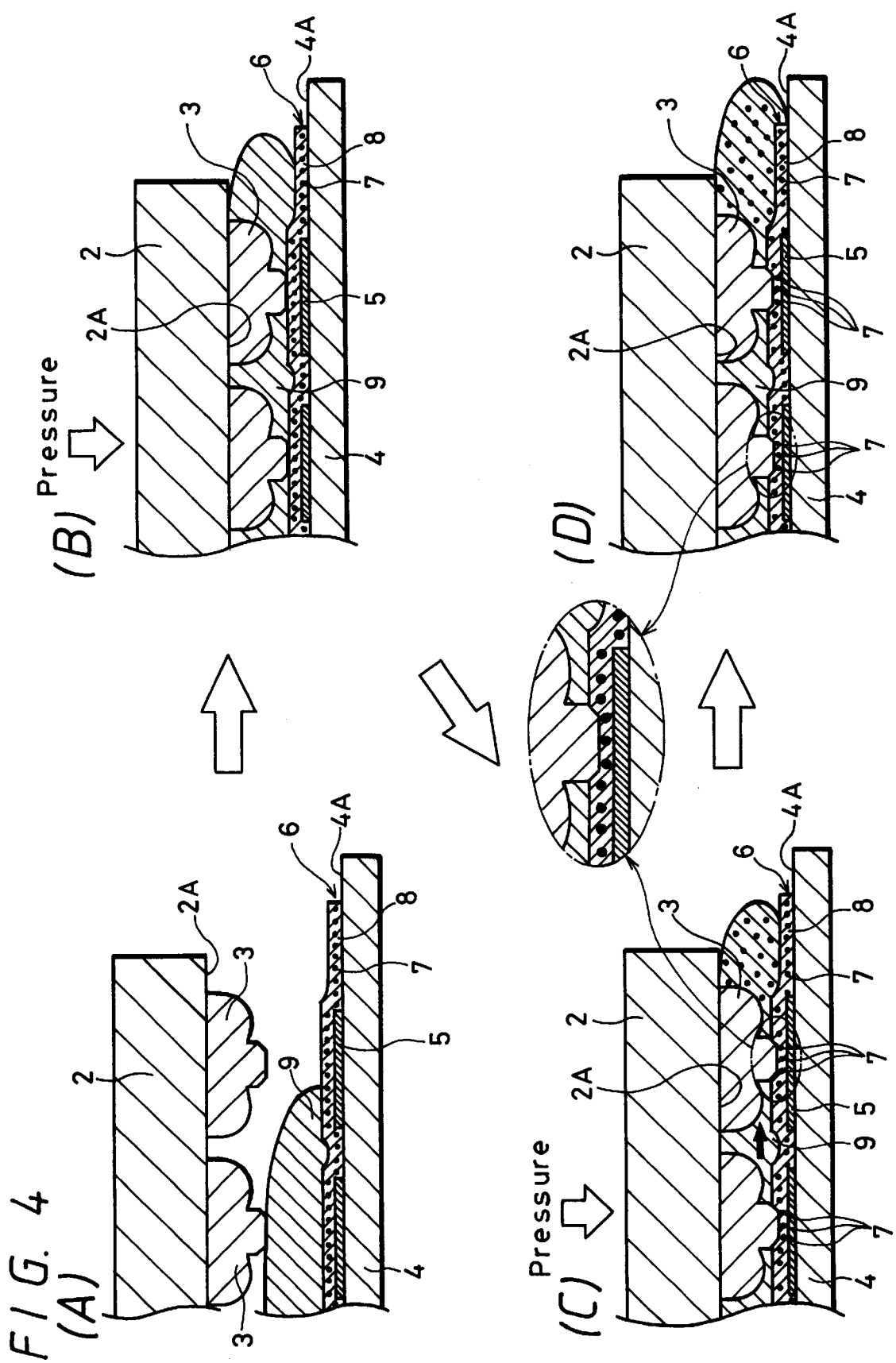
FIG. 4 is a diagram showing an example of electrically connecting the electronic device using the electrical connecting device.

Next, a preferred embodiment of an electrical connecting method for electrically connecting the IC 2 to the printed wiring board 4 with the electrical connecting device 100 will be described with reference to FIGS. 4 and 5.

Figure 5:
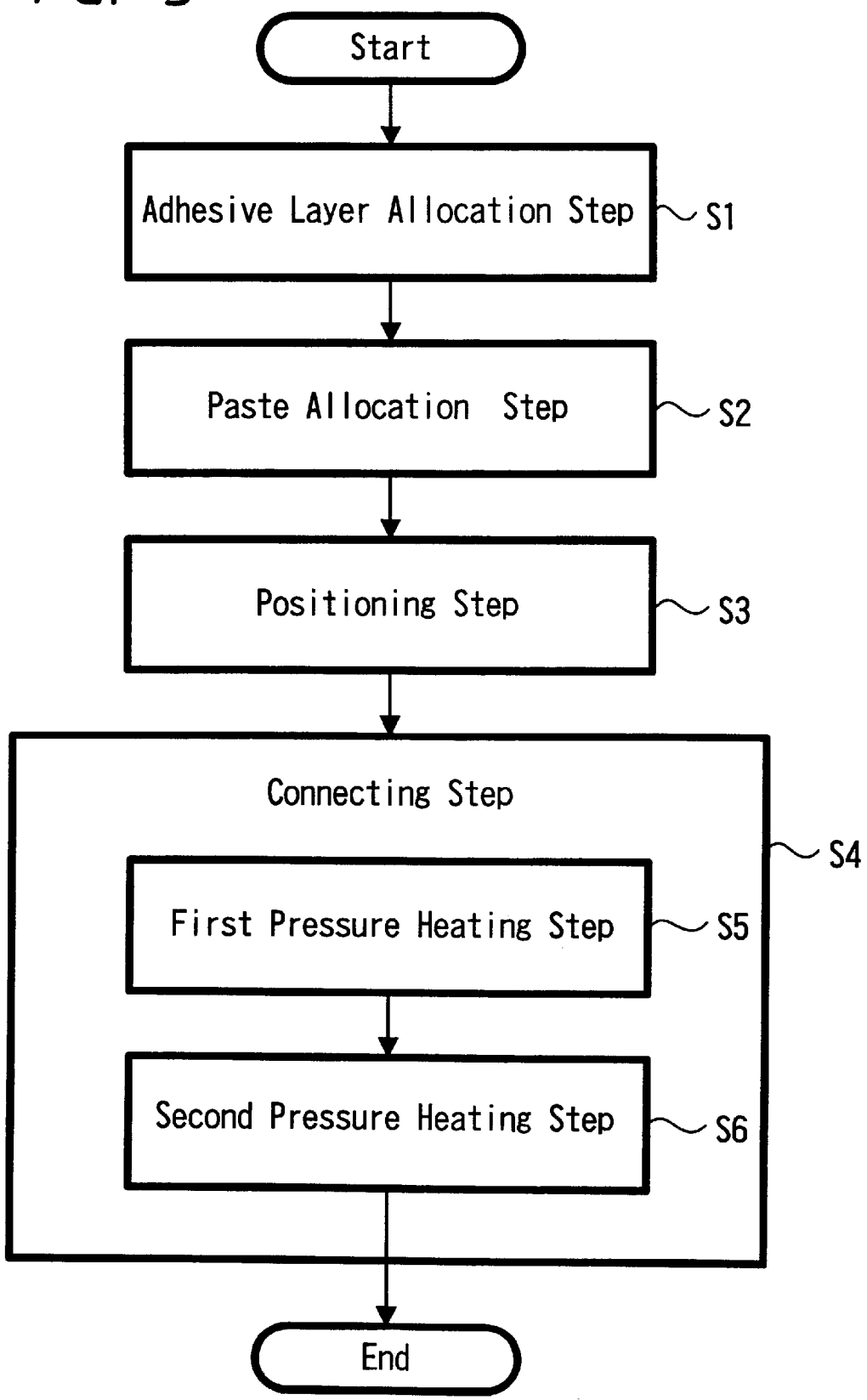
FIG. 5 is a flow chart showing an example of the electrical connecting method of the present invention.

Adhesive Layer Allocation Step S1 of FIG. 5

At step S1, the film-like adhesive layer 6 is attached to the one surface 4A of the printed wiring board 4 as shown in FIGS. 3 and 4(A). In this case, the film-like adhesive layer 6 is attached so as to cover the wiring pattern 5. In this state, the conductive particles 7 are contained completely in the binder 8.

Paste Allocation Step S2

At this step S2, as shown in FIGS. 4(A) and 3, the paste 9 is disposed and coated on the film-like adhesive layer 6. When the paste 9 is coated, it is located in the center portion of the film-like adhesive layer 6 such that it is swollen up.

Positioning Step S3

At step S3, as shown in FIGS. 4(A) and 3, the IC 2 is positioned on the printed wiring board 4. That is, the protruding electrodes 3 of the IC 2 are positioned at positions corresponding to the wiring pattern 5.

Connecting Step S4

The connecting step S4 comprises first pressure heating step S5 and second pressure heating step S6.

At the first pressure heating step S5, as shown in FIG. 4(B), the IC 2 is placed on the film-like adhesive layer 6, so that the paste 9 is spread over along the film-like adhesive layer 6. Thus, as shown in FIG. 4(B), the gap between the one surface 2A of the IC 2 and the film-like adhesive layer 6 is almost filled with the paste 9. The reason of this is that because the viscosity of the paste 9 is lower than that of the film-like adhesive layer 6, only the paste 9 is spread around so that the gap between the one surface 2A of the IC 2 and the film-like adhesive layer 6 is filled with the paste 9. In a state shown in FIG. 4(B), the binder 8 and paste 9 are temporarily hardened just. Therefore, a heat to be applied at this time is of a temperature lower than a glass transition temperature of the paste 9 and binder 8, for example, 80° C. for about three seconds. At that time, a pressure of about 3 kg/mm² is applied to an area of the protruding electrodes 3 of the IC 2 to be connected to the wiring pattern 5 of the printed wiring board 4 via the conductive particles 7 while they are being heated.

Next, at the second pressure heating step S6, as shown in FIG. 4(C), a stronger pressure is applied and the binder 8 and paste 9 are heated at a higher temperature. A temperature at this time is higher than the glass transition temperature of the binder 8 and paste 9, and they are heated, for example, 180–230° C. for 20–30 seconds. At that time, a pressure of about 3 kg/mm2 is applied to an area of the protruding electrodes 3 to be connected to the wiring pattern 5 of the printed wiring board 4 via the conductive particles 7. As a result, because, preferably, the binder 8 and paste 9 have the same or similar components, they can be hardened at substantially the same time. Consequently, as shown in FIG. 4(D), each of the protruding electrodes 3 can be electrically connected to the wiring pattern 5 by using the conductive particles 7 in the film-like adhesive layer 6.

When the IC 2 is heated while being pressurized to the printed wiring board 4 side, only the paste 9 coated on the film-like adhesive layer 6 is made fluid. Therefore, even if there is slight unevenness on the IC 2 and printed wiring board 4, electrical insulation between the IC 2 and the printed wiring board 4 can be sufficiently secured. Because only the paste 9 coated on the film-like adhesive layer 6 is made fluid, even if there is slight unevenness on the IC 2 and the printed wiring board 4, void (air region) between the IC 2 and printed wiring board 4 is reduced thereby reliability being improved.

Further, because the paste 9 and binder 8 are hardened by the pressure heating, the paste 9 and binder 8 having an adhesiveness bond and fix the IC 2 firmly to the printed wiring board 4 side.

At the first pressure heating step S5 of FIG. 4(B), the conductive particles 7 are located such that they are nipped between the protruding electrodes 3 and wiring pattern 5. Then, if a strong pressure is further applied in FIG. 4(C), only the conductive particles 7 located between the protruding electrodes 3 and wiring pattern 5 are nipped firmly between the protruding electrodes 3 and the wiring pattern 5 so that the protruding electrodes 3 are electrically connected to the wiring pattern 5, and the other conductive particles 7 are moved slightly to the periphery thereof. Even if there is slight unevenness on the IC 2 and printed wiring board 4, that unevenness of each electrode is absorbed because the conductive particles 7 exist between the IC 2 and electrodes of the printed wiring board 4, thereby securing a connecting reliability sufficiently.

If the thickness of the adhesive layer 6 is made equal to the diameter of the conductive particle 7 according to the preferred embodiment of the present invention, the conductive particles 7 are nipped further securely between the protruding electrodes 3 of the IC 2 and the wiring pattern 5 formed on the printed wiring board 4.

If according to the preferred embodiment of the present invention, the viscosity of the binder 8 of the adhesive layer 6 is set higher while the viscosity of the paste 9 is lower, the paste 9 is more likely to flow upon temporary pressure-fitting, so that the conductive particles 7 are nipped further securely between the protruding electrodes 3 of the IC 2 and the wiring pattern 5 formed on the printed wiring board 4.

If according to the preferred embodiment of the present invention, the component of the binder 8 of the adhesive layer 6 is made the same as or almost same to the component of the paste 9, even if the binder 8 and paste 9 are mixed when they are heated and made fluid, the connecting reliability is not affected badly.

If according to the preferred embodiment of the present invention, a temperature at the time of the first pressurization is lower than the glass transition temperature of the binder 8, the adhesive layer 6 is capable of maintaining the film shape so that the conductive particles 7 are nipped between the protruding electrodes 3 of the IC 2 and the wiring pattern 5 formed on the printed wiring board 4.

As described above, according to the present invention, even if there is slight unevenness in the wiring pattern 5 formed on the printed wiring board 4, it is possible to realize a connecting member which can achieve an electrical connection via the conductive particles 7 and a connecting method thereof.

By using the adhesive layer 6 which is a film-like connecting resin having a high viscosity, the conductive particles 7 having the same diameter as the film thickness of that layer and the paste 9 which is the connecting resin having a low viscosity, the conductive particles 7 can be interposed securely between the protruding electrode of an electronic part like a bare chip and the conductive pattern of an object, thereby obtaining an electrical conductivity therebetween.

The adhesive layer containing the conductive particles, the thickness of which is substantially same as the diameter of the conductive particle, attached to a predetermined position of the object wiring pattern and the paste constituted of the same reactive adhesive as the component of the binder of the above adhesive layer coated on the adhesive layer are positioned such that the object wiring pattern opposes the protruding electrode of the IC, and after a pressure is applied, the electrical connection is carried out by heating with a pressure.

In the first pressurization, after the connecting members are heated at a temperature lower than the glass transition temperature thereof under a pressure, it is permissible to harden the connecting member by heating under a pressure.

Consequently, upon the first pressurization, only the paste constituted of the same reactive adhesive agent as the component of the binder in the adhesive layer flows, so that the protruding electrodes of the IC and the object wiring pattern are electrically connected to each other through the conductive particles in the adhesive layer containing the conductive particles, having the same thickness as the diameter of the each of the not moved conductive particles.

According to the embodiment of the present invention, the viscosity of the binder in the adhesive layer is made higher while the viscosity of the paste is made lower.

As a result, only the paste constituted of the same reactive adhesive agent as the component of the binder of the adhesive layer having a low viscosity flows when a pressure is applied at first. As a result, the protruding electrodes of the IC and the object wiring pattern can be electrically connected to each other through the conductive particles in the adhesive layer having a higher viscosity and less likely to flow and having the same thickness as the diameter of the conductive particles.

Further, according to the embodiment of the present invention, the conductive adhesive layer having the electrical conductivity is made to have almost the same thickness as the diameter of the conductive particles existing in the adhesive layer.

As a result, because only the conductive particles contributing to electrical connection exist on the bottommost face when fine pitch is carried out, the number of the conductive particles existing in that adhesive layer can be increased. Further, because the total number of the conductive particles can be reduced as compared to a conventional adhesive member, an insulation property relative to adjacent electrodes can be obtained more easily.

According to the embodiment of the present invention, the melting temperature of the binder of the adhesive layer is made higher and the melting temperature of the paste is made lower.

That is, according to the embodiment of the present invention, preferably, the connecting step includes the first pressure heating step for heating at a temperature below the melting temperature of the binder and above the melting temperature of the paste with a pressure, and thereafter the second pressure heating step for heating at a temperature higher than the reaction starting temperature of the binder and paste with a pressure.

As a result, if heating is carried out at a temperature below the melting temperature of the binder and above the melting temperature of the paste with a pressure at the time of the first pressure heating, only the paste flows more, so that the protruding electrodes of the IC and the object wiring pattern can be electrically connected through the conductive particles in the adhesive layer containing the conductive particles, having the same thickness as the diameter of the conductive particles which do not flow below the melting temperature.

The present invention is not limited to the above embodiments.

Although, according to the above embodiment, the first object is the printed wiring board 4 having the wiring pattern 5 and the second object is the IC 2 having the protruding electrodes 3, it is permissible to use a different matter for each object. For example, as the first object, it is permissible to use other kind like a glass substrate having a wiring pattern instead of the printed wiring board. Further, as the second object, it is permissible to use other electronic part in place of the IC2.

Further, as a type of the protruding electrode 3, for example, a plating bump may be employed. The shape of the conductive particles 7 is not restricted to the spherical shape, but other type may be employed.

As described above, according to the present invention, the electrical connection via the conductive particles can be achieved securely regardless of a slight unevenness of an object.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An electrical connecting device for electrically connecting an electrical connecting portion of a first object to an electrical connecting portion of a second object, comprising:

a film-like adhesive layer to be disposed on the first object and constituted of a plurality of conductive particles and a binder containing the conductive particles, wherein the plurality of conductive particles are arranged uniformly in the binder; and a paste disposed on the film-like adhesive layer and having a fluidity.

2. An electrical connecting device according to claim 1, wherein each of the conductive particles has an almost uniform diameter.

3. An electrical connecting device according to claim 1, wherein the material of the paste is the same adhesive agent as the material of the binder of the film-like adhesive layer.

4. An electrical connecting device according to claim 1, wherein the thickness of the film-like adhesive layer is set almost same to or larger than the diameter of each of the conductive particles.

5. An electrical connecting device according to claim 3, wherein the viscosity of the paste is set to be smaller than the viscosity of the film-like adhesive layer.

6. An electrical connecting device according to claim 1, wherein the electrical connecting portion of the first object is a wiring pattern on a circuit substrate, the electrical connecting portion of the second object is an protruding electrode of an electronic part and the conductive particles in the film-like adhesive layer electrically connect the wiring pattern of the circuit substrate to the protruding electrode of the electronic part.

7. An electrical connecting device according to claim 1, wherein the paste includes the same components and defines the same electrical insulation property as the binder.

8. An electrical connecting device according to claim 1, wherein the paste defines a melting temperature that is lower than a melting temperature of the film-like adhesive layer.

9. An electrical device, comprising:

an integrated circuit board comprising a plurality of electrodes, wherein each electrode includes a deflection disposed about a protrusion;

a printed wiring board comprising a wiring pattern disposed in alignment with the plurality of electrodes;

an electrical connecting device comprising an adhesive and a paste disposed on the adhesive, wherein the adhesive comprises a binder and a plurality of conductive particles and is disposed between the wiring pattern and each protrusion of the plurality of electrodes, wherein the plurality of conductive particles are arranged uniformly in the binder, and wherein the paste defines a viscosity that is lower than a viscosity of the binder.

10. The electrical device of claim 9, wherein the paste defines a melting temperature that is lower than a melting temperature of the film-like adhesive layer.

11. The electrical device of claim 9, wherein the paste includes the same components and defines the same electrical insulation property as the binder.

* * * * *